United States Patent
Lamb et al.

(10) Patent No.: US 11,211,942 B2
(45) Date of Patent: Dec. 28, 2021

(54) CIRCUITS, SYSTEMS, AND METHODS FOR PROVIDING ASYNCHRONOUS SAMPLE RATE CONVERSION FOR AN OVERSAMPLING SIGMA DELTA ANALOG TO DIGITAL CONVERTER

(71) Applicant: Analog Devices International Unlimited Company, Limerick (IE)

(72) Inventors: David Lamb, Cupertino, CA (US); Mayur Anvekar, Bangalore (IN); Robert Adams, Acton, MA (US)

(73) Assignee: ANALOG DEVICES INTERNATIONAL UNLIMITED COMPANY, Limerick (IE)

(*) Notice: Subject to any disclaimer, the term of this patent is extended or adjusted under 35 U.S.C. 154(b) by 675 days.

(21) Appl. No.: 16/074,356

(22) PCT Filed: Feb. 1, 2017

(86) PCT No.: PCT/EP2017/052141
§ 371 (c)(1),
(2) Date: Jul. 31, 2018

(87) PCT Pub. No.: WO2017/134097
PCT Pub. Date: Aug. 10, 2017

(65) Prior Publication Data
US 2021/0194497 A1    Jun. 24, 2021

Related U.S. Application Data

(60) Provisional application No. 62/290,408, filed on Feb. 2, 2016.

(51) Int. Cl.
*H03M 7/00* (2006.01)
*H03M 3/00* (2006.01)
(Continued)

(52) U.S. Cl.
CPC .......... *H03M 3/498* (2013.01); *H03H 17/028* (2013.01); *H03H 17/0286* (2013.01); *H03H 17/0628* (2013.01); *H03M 3/462* (2013.01)

(58) Field of Classification Search
CPC ...... H03M 3/462; H03M 3/496; H03M 3/498; H03M 3/50; H03M 3/344; H03M 3/372;
(Continued)

(56) References Cited

U.S. PATENT DOCUMENTS 4,833,474 A * 5/1989 Nagai ................. H03M 3/324
341/166
5,619,202 A * 4/1997 Wilson ................ H03M 3/372
341/123
(Continued)

FOREIGN PATENT DOCUMENTS

| CN | 101263657 | 9/2008 |
| EP | 1742357 | 1/2007 |

(Continued)

OTHER PUBLICATIONS

International Search Report and Written Opinion issued in PCT/EP17/52141 dated Apr. 20, 2017, 17 pages.
(Continued)

*Primary Examiner* — Linh V Nguyen
(74) *Attorney, Agent, or Firm* — Patent Capital Group

(57) ABSTRACT

A variable output data rate converter circuit preferably meets performance requirements while keeping the circuit complexity low. In some embodiments, the converter circuit may include an oversampling sigma delta modulator circuit to quantize an analog input signal at an oversampled rate, and output an sigma delta modulated signal, a transposed polynomial decimator circuit to decimate the sigma delta modulated signal, and output a first decimated signal, and an integer decimator circuit to decimate the first decimated
(Continued)

signal by an integer factor and output a second decimated signal having a desired output data rate. The transposed polynomial decimator circuit has a transposed polynomial filter circuit and a digital phase locked loop circuit, which tracks a ratio between a sampling rate of the first decimated signal and the oversampled rate, and outputs an intersample position parameter to the transposed polynomial filter circuit.

20 Claims, 11 Drawing Sheets

(51) Int. Cl.
*H03H 17/02* (2006.01)
*H03H 17/06* (2006.01)

(58) Field of Classification Search
CPC ........ H03M 1/12; H03M 1/504; H03M 1/822; H03M 3/32; H03M 3/414; H03M 3/418; H03M 3/47
USPC .................................................... 341/143, 61
See application file for complete search history.

(56) References Cited

U.S. PATENT DOCUMENTS

| | | | | |
|---|---|---|---|---|
| 5,621,675 | A * | 4/1997 | Linz | G06F 7/026 708/313 |
| 5,638,010 | A | 6/1997 | Adams | |
| 5,748,126 | A * | 5/1998 | Ma | G06J 1/00 341/143 |
| 6,215,423 | B1 * | 4/2001 | May | H03H 17/0614 341/143 |
| 6,279,019 | B1 * | 8/2001 | Oh | H03H 17/0671 708/300 |
| 6,473,475 | B1 | 10/2002 | Putzeys | |
| 6,650,258 | B1 | 11/2003 | Kelly et al. | |
| 8,369,973 | B2 * | 2/2013 | Risbo | G11B 20/10527 700/94 |
| 8,593,189 | B1 * | 11/2013 | Yen | H03M 1/50 327/156 |
| 2001/0037351 | A1 * | 11/2001 | Hellberg | H03H 17/0628 708/313 |
| 2006/0179095 | A1 | 8/2006 | Lo Muzio et al. | |
| 2007/0013566 | A1 | 1/2007 | Chuang | |
| 2007/0192392 | A1 * | 8/2007 | Tinker | H03H 17/0628 708/300 |
| 2008/0123618 | A1 | 5/2008 | Papadopoulos | |
| 2015/0145585 | A1 | 5/2015 | Tsai et al. | |

FOREIGN PATENT DOCUMENTS

| | | |
|---|---|---|
| KR | 20060082803 | 7/2006 |
| WO | 1999/056427 | 11/1999 |
| WO | 2013085240 | 6/2013 |

OTHER PUBLICATIONS

Babic et al., *Implementation of the Transposed Farrow Structure*, 0-7803-7448-7/02 © 2002 IEEE, 4 pages.
Michael et al., *Reconfigurable Architecture for Arbitrary Sample Rate Conversion in Software Defined Radios*, 978-1-4244-2644-7 © 2008 IEEE, 6 pages.
Babic et al., *Sampling Rate Conversion for Arbitrary Ratio Using Transposed Linear Interpolation and CIC Filter*, date unknown, retrieved from https://pdfs.semanticscholar.org/4bfd/8bba47179c0b28f21ad0dd419b91cba28588.pdf.
Babic et al., *Prolonged Transposed Polynomial-based Filters for Decimation, Circuits and Systems*, 2003, ISCAS 2003, Proceedings of the 2003 International Symposium on. vol. 4, IEEE 2003, 4 pages.
Babic et al., *Decimation by Non-Integer Factor in Multistandard Radio Receivers*, Signal Processing, Elsevier.com, (2005), pp. 1211-1224.
Office Action mailed in CN Application No. 201780009141.1 dated Jun. 6, 2021, 10 pages—includes search report on pp. 9-10.

* cited by examiner ized signal (i.e., a sigma delta output stream), and perform digital post processing on the quantized signal to generate a digital output suitable for a particular application. After decimating the quantized signal, the power of the input signal remains but the power of the quantization noise is attenuated, providing an improved signal to noise ratio.

CIRCUITS, SYSTEMS, AND METHODS FOR PROVIDING ASYNCHRONOUS SAMPLE RATE CONVERSION FOR AN OVERSAMPLING SIGMA DELTA ANALOG TO DIGITAL CONVERTER

PRIORITY DATA

This application is an PCT Application claiming priority to U.S. Provisional Patent Application Ser. No. 62/290,408, filed Feb. 2, 2016 and entitled "Circuits, Systems, and Methods for Providing Asynchronous Sample Rate Conversion for an Oversampling Sigma Delta Analog to Digital Converter", which is hereby incorporated by reference in its entirety.

TECHNICAL FIELD OF THE DISCLOSURE

The present invention relates to the field of integrated circuits, in particular to circuits, systems, and methods for providing asynchronous sample rate conversion for an oversampling sigma delta analog to digital converter.

BACKGROUND

Many applications require analog to digital conversion to be performed with high signal to noise ratios and linearity. Oversampling analog to digital converters are an increasingly popular way to implement analog to digital conversion in a manner to achieve high signal to noise ratios. In such converters, an input signal confined to a certain frequency range is quantized at a rate significantly higher than the Nyquist frequency of this range. While the power of the input signal remains within this frequency range, the power of the quantization noise is spread over the much larger frequency range.

Sigma delta modulators are a popular way of providing further improvements to the signal to noise ratio. In such modulators, quantization is performed in a manner so as to reduce the noise imparted by the quantization in the frequency range of the signal while maintaining sufficient gain for the signal. An oversampling sigma delta converter may include a sigma delta modulator to generate a quantized signal (i.e., a sigma delta output stream), and perform digital post processing on the quantized signal to generate a digital output suitable for a particular application. After decimating the quantized signal, the power of the input signal remains but the power of the quantization noise is attenuated, providing an improved signal to noise ratio.

BRIEF SUMMARY OF THE DISCLOSURE

A variable output data rate converter circuit preferably meets performance requirements while keeping the circuit complexity low. In some embodiments, the converter circuit may include an oversampling sigma delta modulator circuit to quantize an analog input signal at an oversampled rate, and output an sigma delta modulated signal, a transposed polynomial decimator circuit to decimate the sigma delta modulated signal, and output a first decimated signal, and an integer decimator circuit to decimate the first decimated signal by an integer factor and output a second decimated signal having a desired output data rate. The transposed polynomial decimator circuit has a transposed polynomial filter circuit and a digital phase locked loop circuit, which tracks a ratio between a sampling rate of the first decimated signal and the oversampled rate, and outputs an intersample position parameter to the transposed polynomial filter circuit.

BRIEF DESCRIPTION OF THE DRAWINGS

To provide a more complete understanding of the present disclosure and features and advantages thereof, reference is made to the following description, taken in conjunction with the accompanying figures, wherein like reference numerals represent like parts, in which.

DESCRIPTION OF EXAMPLE EMBODIMENTS OF THE DISCLOSURE

Design Considerations for Oversampling Sigma Delta Converters

In some systems, it is preferable to obtain a digitized signal at a variable output data rate from the quantized signal generated by an oversampling sigma delta modulator. In other words, it is preferable to implement a variable data rate oversampling sigma delta converter. Implementations of variable rate oversampling sigma delta converters often meet performance specifications only when operating at predetermined sampling and output data rates. Requirements on sampling and output data rates can be inflexible or inconvenient. Worst yet, such requirements on the rates may not coincide with output data rates required by a particular application. This problem is compounded when an application requires a variable output data rate that is asynchronous to a clock of or a clock being provided to the converter. Therefore, it would be advantageous to implement circuits, systems and methods for providing oversampling sigma delta analog to digital conversion with variable asynchronous output data rates, while still meeting performance criteria such as signal to noise and linearity specifications.

Exemplary Converter Circuits

The present disclosure describes embodiments of a converter circuit providing oversampling sigma delta analog to digital conversion and variable asynchronous output data rate conversion. The converter circuit may include one or more components to provide oversampling sigma delta modulation of an analog input signal at an oversampled rate synchronous to a received clock signal, and one or more components to set an sample rate of an output data signal at a received output data rate that may be variable and asynchronous to the clock signal.

Figure 1:
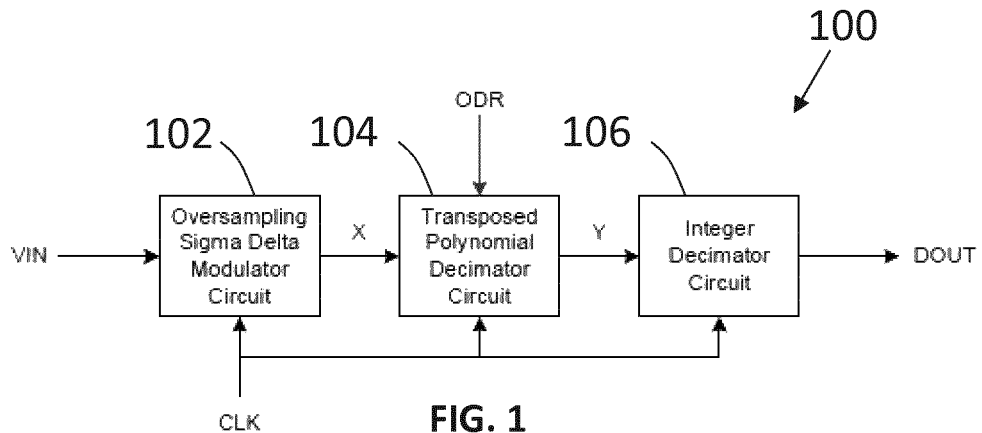
FIG. 1 depicts an exemplary converter circuit to provide oversampling sigma delta analog to digital conversion with a variable asynchronous output data rate, according to some embodiments of the disclosure.

FIG. 1 depicts an exemplary converter circuit to provide oversampling sigma delta analog to digital conversion with a variable asynchronous output data rate, according to some embodiments of the disclosure. In FIG. 1, the converter circuit may include an oversampling sigma delta modulator circuit 102, a transposed polynomial decimator circuit 104, and an integer decimator circuit 106.

The oversampling sigma delta modulator circuit 102 may receive an analog input signal VIN, and modulate (quantize) the input signal to output an oversampled sigma delta modulated signal X. The signal X can be a sigma delta modulated stream or quantized (digital) signal representative of the analog input signal. The oversampling sigma delta modulator circuit 102 may output or produce the sigma delta sigma modulated signal at an oversampled rate that may be considered to be a product of an oversampling ratio OSR multiplied by a Nyquist frequency FSIN for a bandwidth limited input signal (input signal being VIN), or OSR*FSIN (the oversampled rate is a product of an oversampling ratio OSR and a Nyquist frequency FSIN). Clock signal CLK clocking the oversampling sigma delta modulator circuit 102 may have a frequency of OSR*FSIN. The signal X may have a sampling rate of OSR*FSIN.

The transposed polynomial decimator circuit 104 may receive the oversampled sigma delta modulated signal, and decimate the modulated signal to output a first decimated signal, i.e., a corresponding decimated signal Y. The transposed polynomial decimator circuit 104 may output or produce the decimated signal at a first sample rate that may be a product of an integer N and a desired output data rate ODR, or N*ODR. The transposed polynomial decimator circuit 104 thus may reduce the rate of the oversampled sigma delta modulated signal by a factor of (N*ODR)/(OSR*FSIN).

The integer decimator circuit 106 receives the first decimated signal (signal Y) and decimates the first decimated signal (signal Y) or reduces the rate of the first decimated signal by a factor of an integer N (or integer factor N). The integer decimator circuit 106 outputs or produces a corresponding a second decimated signal (i.e., digital output signal DOUT) having a desired output data rate ODR.

The desired output data rate ODR, and thus the integer multiple of the output data rate (i.e., rate of the first decimated signal, or N*ODR), may be asynchronous and/or variable relative to the oversampled rate.

Figure 2:
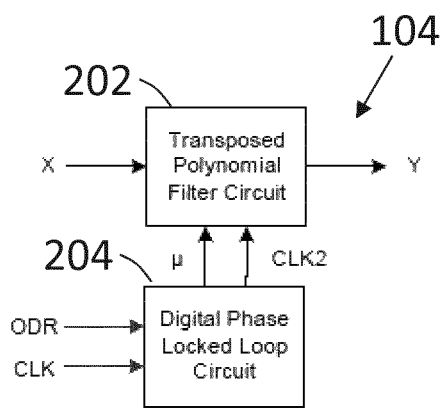
FIG. 2 depicts an exemplary transposed polynomial decimator circuit, according to some embodiments of the disclosure.

FIG. 2 depicts an exemplary transposed polynomial decimator circuit 104, according to some embodiments of the disclosure. The transposed polynomial decimator circuit 104 may include a transposed polynomial filter circuit 202 and a digital phase locked loop circuit 204. The digital phase locked loop circuit 204 tracks a ratio between the desired output data rate and the oversampled rate and outputs an intersample position parameter μ to the transposed polynomial filter circuit 202.

The transposed polynomial filter circuit 202 may receive the oversampled sigma delta modulated signal (signal X), an intersample position parameter μ, and a second clock signal (CLK2) at the integer multiple of the desired output data rate (e.g., CLK2 has a frequency of N*ODR). The intersample position parameter μ may represent the distance between samples of the oversampled sigma delta modulated signal at which the transposed polynomial filter circuit may calculate a new sample. More specifically, the intersample position parameter μ is the distance between a current input sample and a last output sample of the transposed polynomial filter circuit 202 (or the overall transposed polynomial decimator circuit 104). The distance can be represented a number between 0 and 1, normalized at the output sample rate (output sample period). For some other (non-transposed) polynomial filters, it is typical to find a distance between the current output sample and the last input sample of the filter (meaning the filter performs an opposite, different function).

The digital phase locked loop circuit 204 may receive the clock signal on which the oversampling sigma delta modulated signal rate is based (represented by CLK in the FIGURE, the CLK signal having a rate of OSR*FSIN) and a clock signal representing the desired output data rate (represented by ODR in the FIGURE), and provide the intersample position parameter μ and the second clock signal (CLK2) at the integer multiple of the desired output data rate (N*ODR). To provide the intersample position parameter μ, the digital phase locked loop circuit 204 calculates a ratio between the desired output data rate and the oversampled rate of the oversampling sigma delta modulator (synchronous with CLK). In other words, the ratio can be a ratio between ODR and (OSR*FSIN).

Embodiments illustrated by FIGS. 1, 2, 19, and 20 may provide a number of advantages mentioned herein.

Comparing Against Another Design Having an Asynchronous Sample Rate Converter

Figure 3:
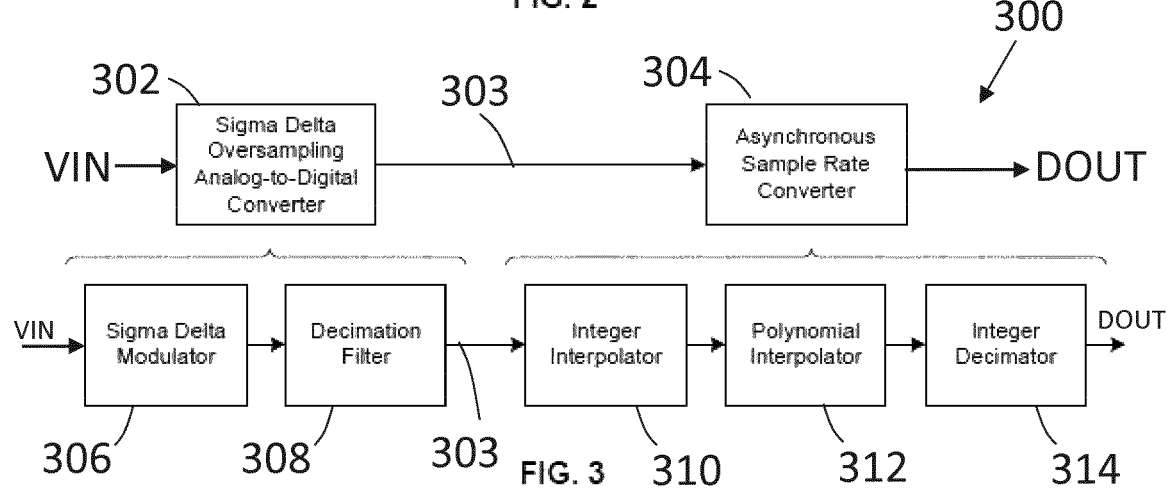
FIG. 3 depicts an exemplary converter circuit that may implement oversampling sigma delta analog to digital conversion and asynchronous data rate conversion in a different manner.

FIG. 3 depicts an exemplary converter circuit 300 that may implement oversampling sigma delta analog to digital conversion and asynchronous sample rate conversion in a different manner. The converter circuit 300 may include an oversampling sigma delta analog to digital converter (ADC) 302, and an asynchronous sample rate converter 304.

The oversampling sigma delta ADC 302 may include a sigma delta modulator 306 and a digital decimation filter 308. The oversampling sigma delta ADC 302 may receive an analog input signal (VIN), and convert the analog input signal to produce a first digital output 303 at a first output data rate synchronous to a clock signal of the oversampling delta sigma ADC 302.

The asynchronous sample rate converter 304 may include an integer interpolator 306, a polynomial interpolator 312, and an integer decimator 314. The asynchronous sample rate converter 304 may receive the first digital output 303; interpolate, by the integer interpolator 310, to upsample by a first fixed integer factor; interpolate, by the polynomial interpolator 312, to upsample by a second variable factor as a function of a desired output data rate; and decimate, by the integer decimator 314, to downsample by a fixed integer factor to produce a second digital output signal DOUT at the desired output data rate.

As can be seen from FIGS. 1 and 3, the converter circuit of FIG. 1 thus may provide oversampling sigma delta analog to digital conversion and asynchronous sample rate conversion at a significant savings in circuitry, and thus product cost, area, complexity, etc., in comparison to the converter circuit of FIG. 3, by eliminating the need for the use of at least the digital decimation filter 306 of the oversampling sigma delta ADC 302 and the integer interpolator 310 of the asynchronous sample rate converter 304.

Additionally, attempting to overcome the deficiencies of the converter circuit of FIG. 3 by merely omitting the digital decimation filter 308 of the oversampling sigma delta ADC 308 and the integer interpolator 310 of the asynchronous sample rate converter 304, and feeding the oversampled sigma delta modulated signal from sigma delta modulator 306 to the polynomial interpolator 312, may not produce desirable signal to noise performance. To understand why this is so, the frequency spectra of signals of the converter of FIG. 3 may be considered.

Figure 4:
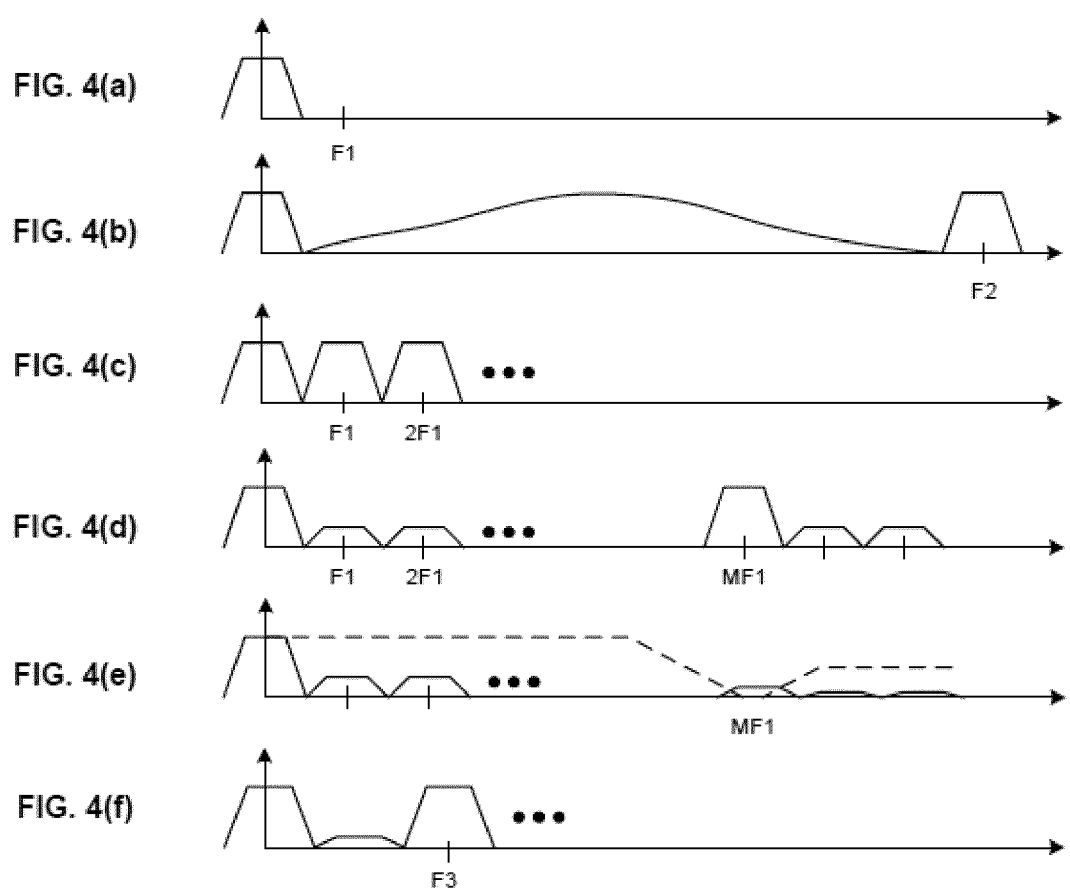
FIGS. 4(a)-4(f) are graphs depicting embodiments of frequency spectra of signals of the oversampling sigma delta ADC of FIG. 3.

FIGS. 4(a)-4(f) are graphs depicting embodiments of frequency spectra of signals of the oversampling sigma delta ADC of FIG. 3. FIG. 4(a) depicts an embodiment of a frequency spectrum of an analog input signal VIN provided to the sigma delta modulator 306 of FIG. 3. The spectrum may include the original signal spectrum below a Nyquist frequency F1. FIG. 4(b) depicts an embodiment of a frequency spectrum of an oversampled sigma delta modulated signal produced by the sigma delta modulator 306 of FIG. 3. The spectrum may include an image of the signal spectrum at the oversampling frequency F2 and noise shaped between the original signal spectrum and this image. FIG. 4(c) depicts an embodiment of a frequency spectrum of a decimated output signal produced by the digital decimation filter 308 of FIG. 3. The spectrum may include the original signal spectrum and images of the signal spectrum at the output sampling frequency, such as at multiples of the Nyquist frequency. FIG. 4(d) depicts an embodiment of a frequency spectrum of an interpolated signal produced by the integer interpolator 310 of FIG. 3. The spectrum may include the original signal spectrum, images of the signal spectrum at the integer multiples of the sampling frequency of the decimated output signal, and likely attenuated images at lesser multiples of the sampling frequency of the decimated output signal. FIG. 4(e) depicts an embodiment of a frequency spectrum of the interpolated signal produced by the polynomial interpolator 312 of FIG. 3, along with a representation of the filtering performed by a polynomial interpolation filter, which has zeros, and thus maximum attenuation, clustered around the sampling rate input to the filter, or in this case the integer multiples of the sampling frequency of the decimated signal. The spectrum may include the original signal spectrum and attenuated images of the signal spectrum at the new interpolated sampling frequency. FIG. 4(f) depicts an embodiment of a frequency spectrum of the decimated signal produced by the integer decimator 314 of FIG. 3. The spectrum may include the original signal spectrum and an image of the signal spectrum at an output data rate F3.

If the digital decimation filter 308 of the oversampling sigma delta ADC 302 and the integer interpolator 310 of the asynchronous sample rate converter 304 are merely omitted, and the oversampled sigma delta modulated signal (output from the sigma delta modulator 306) fed to the polynomial interpolator 312, a degradation in signal to noise performance may occur. As can be seen in FIG. 4(b), the spectrum of the oversampled sigma delta modulated signal includes not only the spectrum of the original signal and the image at the oversampled rate, but also the shaped noise between them, including at bands of concern for aliasing around the output data rate frequency and its multiples. Feeding this signal into the polynomial interpolator 312 directly, with zeros clustered around the input rate, would result in the shaped noise in these aliasing bands being folded into the spectrum of the output signal.

Simplifying Overall Complexity while Achieving Noise Performance

Returning to FIG. 1, the converter circuit 100 can improve signal to noise ratio by providing the oversampled sigma delta modulated signal X to the transposed polynomial decimator circuit 104. The transposed polynomial decimator circuit 104 may calculate a new sample as a function of an intersample position parameter μ. The intersample position parameter μ can track the desired output data rate with respect to the oversampled rate of the oversampled sigma delta modulated signal X, thus allowing the intersample position parameter μ change dynamically and adjust according to any changes in the desired output data rate (ODR) or the oversampled rate (CLK). Furthermore, the intersample position parameter μ normalized to the period of its output signal, and thus provide a transfer function having zeros, or regions of maximum attenuation, clustered about multiples of its output data rate. The transposed polynomial decimator circuit 104 may thus attenuate shaped noise present in the modulated signal at the aliasing bands associated with the output data rate, and prevent this noise from being folded into the output. By contrast, a polynomial interpolator (e.g., polynomial interpolator 312 of FIG. 3) may have zeros, and may thus attenuate, at regions clustered about multiples of the input data rate, which would undesirably allow shaped noise in the modulated signal at the aliasing bands associated with the output data rate to be folded into the output.

Figure 5:
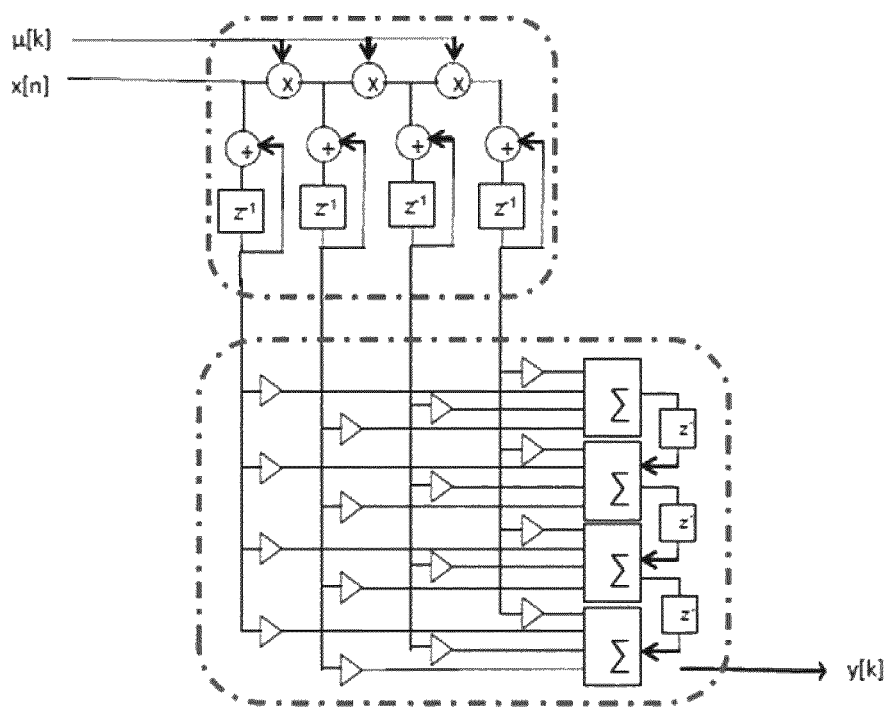
FIG. 5 depicts an exemplary transposed third order spline filter implemented using a transposed Farrow structure, according to some embodiments of the disclosure.

Implementing the Transposed Polynomial Filter and Advantages of Using a Transposed Polynomial Filter The transposed polynomial filter (e.g., 202 of FIG. 2) of the transposed polynomial decimator circuit (e.g., 104 of FIG. 2) may have an order greater than one. In one embodiment, the transposed polynomial filter may be a third order polynomial filter, such as third order spline filter. FIG. 5 depicts an exemplary transposed third order spline filter implemented using a transposed Farrow structure, according to some embodiments of the disclosure. The filter may receive an input data sequence x[n] and an intersample position parameter μ[k], and generate an output data sequence y[k] having samples positioned at the intersample positions. The filter may include one or more summing elements, one or more multipliers, and one or more delay elements. As discussed above, the filter may have zeros clustered around multiples of the output frequency instead of multiples of the input frequency.

Different embodiments of the transposed polynomial filter may be based on different types of polynomials. In one embodiment, such as the one shown in FIG. 5, the transposed polynomial filter may be based on a spline polynomial. In other embodiments, transposed polynomial filter may be based on other polynomials, such one or more of a Lagrange polynomial, a Hermite polynomial, etc.

Figure 6:
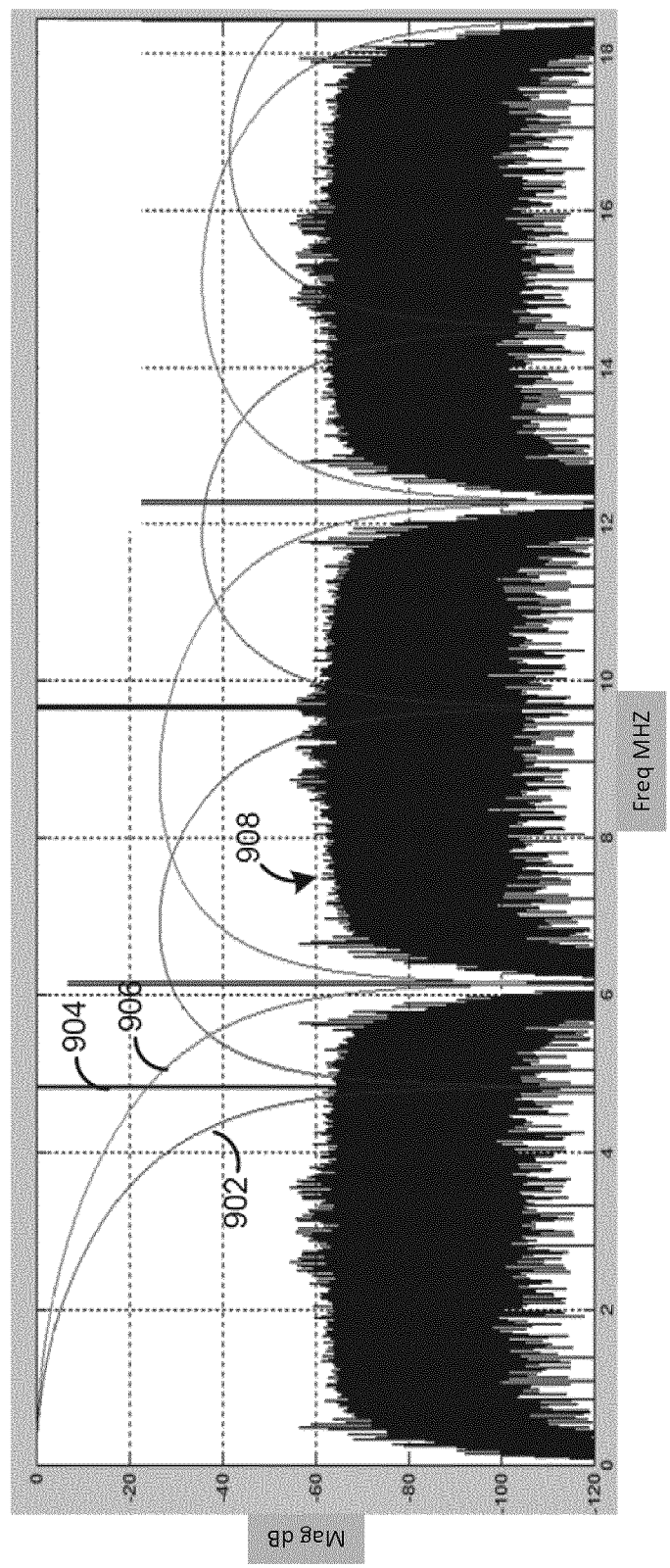
FIGS. 6-7 are graphs that show simulated results for the exemplary converter circuit of FIG. 1, according to some embodiments of the disclosure.
Figure 7:
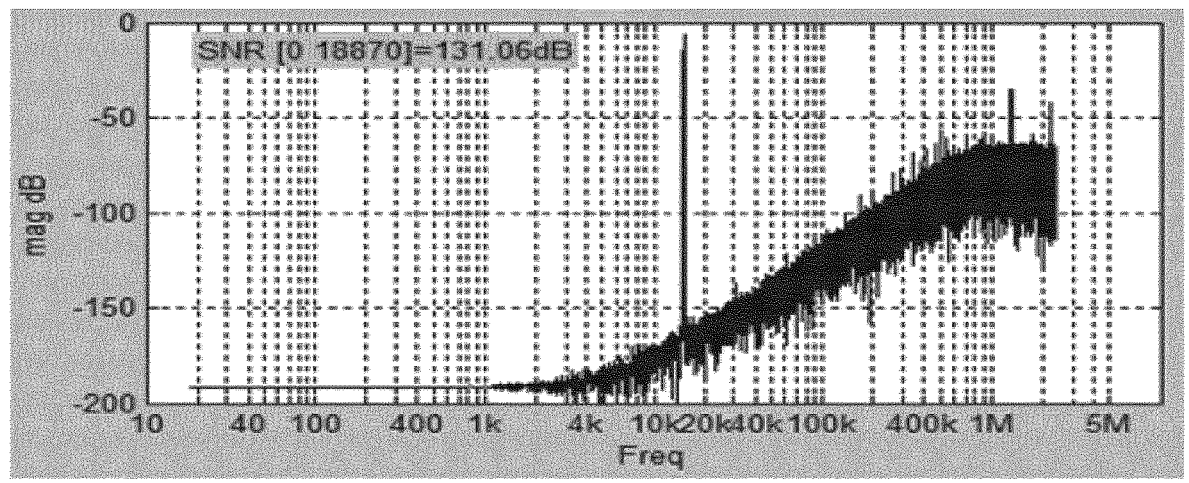

Embodiments of the converter circuit illustrated by FIG. 1 thus may provide improved signal to noise ratios and other performance metrics. FIGS. 6-7 are graphs that show simulated results for the exemplary converter circuit of FIG. 1, according to some embodiments of the disclosure. FIG. 6 depicts a frequency spectrum of a transfer function 902 of an embodiment of the transposed polynomial decimator circuit, having zeros clustered around potential aliasing regions 904 for the output signal at the output data rate. FIG. 7 depicts a frequency spectrum of an output of an embodiment of the converter circuit, showing a good signal to noise ratio.

Figure 8:
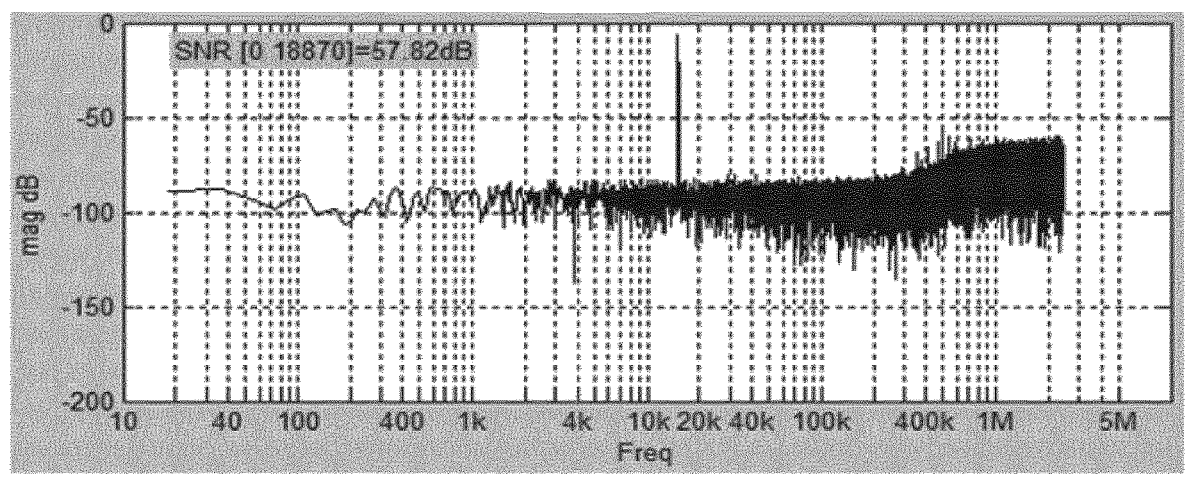
FIG. 8 depicts an embodiment of a frequency spectrum of an output of a converter circuit using a polynomial interpolator, showing an unsatisfactory signal to noise ratio.

A converter circuit similar to that of FIG. 1, but which uses a polynomial interpolator (e.g., FIG. 3) instead of a transposed polynomial decimator, may suffer reduced signal to noise ratios and other performance metrics. Returning to FIG. 6, this graph also depicts a frequency spectra 906 for an embodiment of a polynomial interpolator circuit, having zeros clustered around multiples of the input data rate. Such would provide filtering of unwanted signals 908 at these locations, but not at the regions 904 of concern for aliasing about the output data rate. FIG. 8 depicts an embodiment of a frequency spectrum of an output of a converter circuit using a polynomial interpolator, showing an unsatisfactory signal to noise ratio.

Implementing the Integer Decimator Circuit

Figure 9:
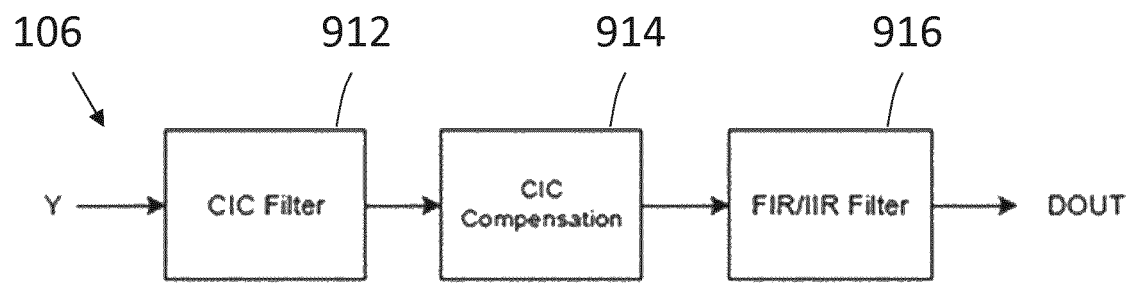
FIG. 9 depicts an exemplary integer decimator circuit having a plurality of filter stages, according to some embodiments of the disclosure.

The integer decimator may include one or more filter stages to collectively provide the integer decimation. FIG. 9 depicts an exemplary integer decimator circuit 106 having a plurality of filter stages, according to some embodiments of the disclosure. The integer decimator circuit 106 may include a CIC filter 912, a CIC compensation circuit 914, and a FIR/IIR filter 916, which may collectively provide the integer decimation. The integer decimator circuit 106 decimates signal Y (first decimated signal from the transposed polynomial decimator circuit 104 of FIG. 1) and generates digital output signal DOUT (second decimated signal) having a desired output data rate ODR. One or more filter stages of the integer decimator 106 may have an order greater than one.

The integer decimator circuit (e.g., 106 of FIG. 1) divides the sample rate of the signal Y by an integer factor N. The value of the integer N may be selected on the basis of the circuits used to implement the transposed polynomial decimator circuit (e.g., 104 of FIG. 1) and the integer decimator (e.g., 106 of FIG. 1), and/or vice versa. For example, a relatively higher value of N may correspond to a relatively lower order of the transposed polynomial filter of the transposed polynomial decimator circuit, and a relatively higher order of a filter stage of the integer decimator. By contrast, a relatively lower value of N may correspond to a relatively higher order of the transposed polynomial filter of the transposed polynomial decimator circuit, and a relatively lower order of a filter stage of the integer decimator.

In some embodiments, the integer decimator circuit 106 can include a plurality of stages coupled in cascade to progressively decimate the input signal to lower sampling rates to reach the integer decimation factor of N. For instance, the integer decimator circuit 106 can include a first integer decimator circuit stage having an integer decimation factor of N/X, and a second integer decimator circuit stage having an integer decimation factor of X. Together the two stages can reach the integer decimation factor N. More stages and different suitable integer decimation factors can be implemented. An integer decimator circuit having one or more stages having smaller integer decimation factors can simply the circuit design, since higher integer decimation factors can greatly increase circuit complexity. To simplify implementation of these stages in the integer decimator circuit 106 (including the clocking of the different sample rates of data coming out of these stages), it can be preferable to set the integer decimation factors of the stages (e.g., N/X, X, etc.) to be powers of two.

Implementing the Oversampling Sigma Delta Modulator

Figure 10:
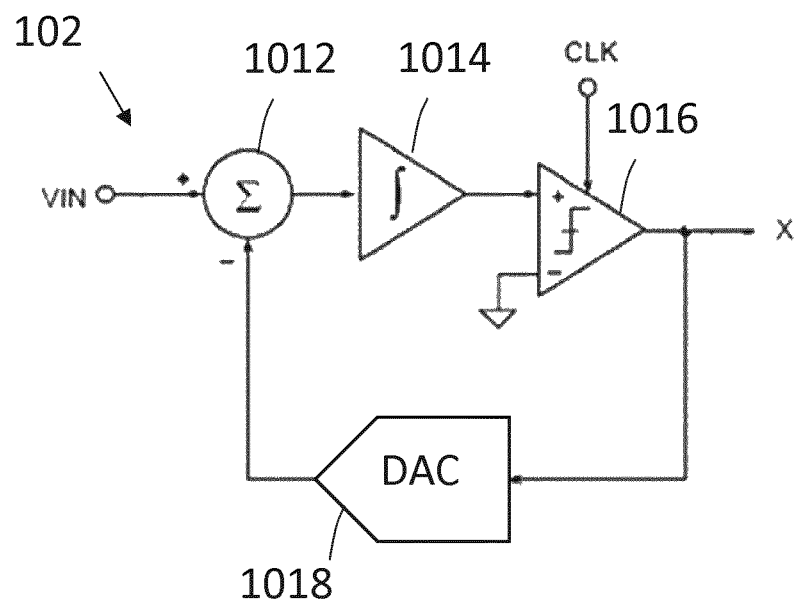
FIG. 10 depicts an exemplary oversampling sigma delta modulator to receive the analog input signal and provide the oversampled sigma delta modulated signal, according to some embodiments of the disclosure.

FIG. 10 depicts an exemplary oversampling sigma delta modulator 102 to receive the analog input signal and provide the oversampled sigma delta modulated signal, according to some embodiments of the disclosure. The oversampling sigma delta modulator 102 may include a summation circuit 1012, an integrator 1014, a latched comparator or other 1-bit ADC 1016, and a 1-bit digital to analog converter 1018 in a feedback configuration. The depicted oversampling sigma delta modulator 102 may provide 1-bit analog to digital conversion and 1-bit digital to analog conversion. Other embodiments of the oversampling sigma delta modulator may provide n-bit modulation by replacing the latched comparator or other 1-bit ADC 1016 with an n-bit ADC such as a flash ADC, and replacing the 1-bit DAC 1018 with an n-bit DAC.

Implementing the Digital Phase Locked Loop

Figure 11:
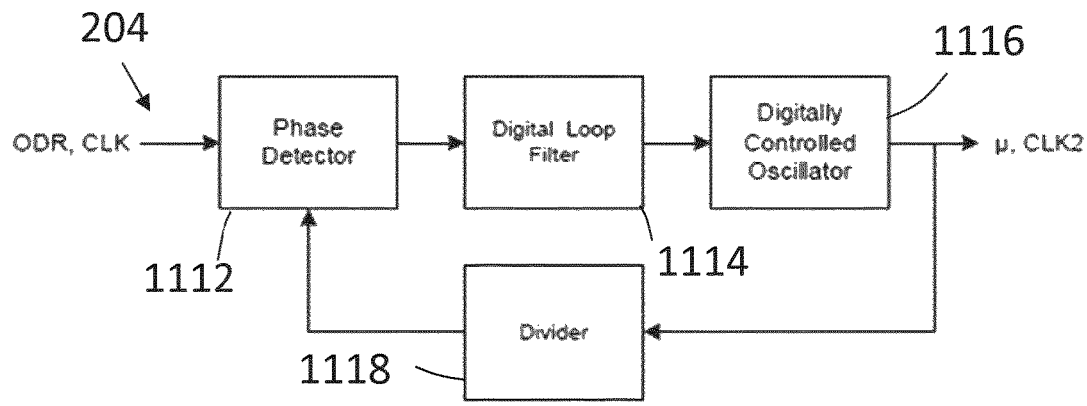
FIG. 11 depicts an exemplary digital phase locked loop circuit, according to some embodiments of the disclosure.

FIG. 11 depicts an exemplary digital phase locked loop circuit 204, according to some embodiments of the disclosure. The digital phase locked loop circuit 204 may include a phase detector circuit 1112, a digital loop filter circuit 1114, a digitally controlled oscillator circuit 1116, and a divider circuit 1118. Details regarding the digital phase locked loop circuit 204 are described in relation to FIGS. 1, 2, 19 and 20.

Referring back to FIG. 1, the oversampling sigma delta modulator circuit 102 can run on its own oscillator circuit, since the digital phase locked loop circuit 204 can dynamically track the desired output data rate ODR and modify the intersample position parameter accordingly. Running on its own oscillator circuit with the fixed clock CLK, the oversampling sigma delta modulator circuit can be much easier to design and implement. Note that the integer decimator circuit may have a fixed integer decimation factor of N. However, the desired output data rate ODR (sampling rate of DOUT) may vary. Providing the digital phase locked loop circuit 204 can calculate and track the intersample position parameter as the output data rate ODR varies, so that the transposed polynomial filter circuit 202 can compute the samples of Y properly.

The digital phase locked loop circuit 204 receives two clocks. In this case, it receive the clock which drives the oversampling sigma delta modulator circuit 102 (shown as CLK), and a clock representing or having the desired output data rate (shown as ODR). The digital phase locked loop circuit 204 is implemented to determine the ratio between the frequency of CLK and the frequency of ODR. The two received clocks can drive two respective integrators or counters. One of the integrators/counters (e.g., the integrator/counter receiving the faster clock) sets the increment value based on the current ratio. The digital phase locked loop circuit adjusts the determined ratio to drive the difference of the two integrators/counters to match in slope, or the error between the two integrators/counters to be zero. Intersample position parameter corresponds to the distance the current input sample and the previous/last output sample (which can be a value between 0 and 1, normalized to the output sample rate or output sample period). It is possible to use the two counters being driven by the two clocks to determine the distance. The contents of the counter driven by the faster clock and incrementing every cycle of the faster clock (in this case CLK) can yield the distance between the current input sample and the previous/last output sample.

The intersample position parameter determination further may take into account the integer decimation ratio N of the integer decimator circuit 106, since the ratio of interest is between the frequency of CLK (oversampled rate of the oversampling sigma delta modulator 102 or sampling rate of signal X) and the frequency of N*ODR (output sampling rate of the decimated signal Y from the transposed polynomial decimator circuit 106). If the intersample position parameter is computed based on CLK and ODR (desired output data rate from the integer decimator circuit), the intersample position parameter (provided by the integrator/counter clocked by CLK) may be adjusted mathematically to take into account that the ratio of interest is actually between CLK and N*ODR.

In some cases, the digital phase locked loop circuit can instead receive CLK/N and ODR. In other words, the digital phase locked loop circuit receives a clock signal having an integer divided oversampled rate (CLK/N), and the ratio is being calculated based on the clock signal having the integer divided oversampling rate (CLK/N) and the clock signal having the desired output data rate (ODR). The intersample position parameter is still being integrated at the oversampled rate (CLK) and updated at every clock cycle of CLK. In other words, the calculated ratio is being integrated at the oversampled rate CLK in order to provide the intersample position parameter at the right sampling rate, i.e., CLK. This implementation has several advantages. If digital phase locked loop circuit 204 receives CLK/N instead of CLK, the ratio between sampling rates of CLK/N and ODR is bigger than the ratio of CLK and ODR. This can greatly reduce the complexities (i.e., reduce the size of the data path of the digital phased locked loop) of the circuitry in digital phase locked loop circuit 204 of FIG. 2. The lock in range and data path depth of the digital phased locked loop is thus substantially reduced and stability is easier to achieve. For instance, the integrators/counters can be smaller (less bits are needed). By receiving CLK/N instead of CLK, the digital phase locked loop circuit 204 does not have to take an additional step to adjust the intersample position parameter according to N, since the ratio of CLK and (N*ODR) is the same as the ratio of (CLK/N) and ODR.

It is not a requirement to divide CLK by N, i.e., the integer factor of the integer decimation circuit for dividing the oversampled clock (CLK). In general, the oversampled clock CLK can be divided by F, such that CLK/F is closer to ODR in absolute frequency. F is chosen to increase the ratio of interest such that the digital phased locked loop design is more manageable from an arithmetic point of view.

Using the Digital Phased Locked Loop Circuitry to Clock Signals

In some cases, the digital outputs and any intermediate digital signals in the transposed polynomial decimator circuit and the integer decimator circuit can be clocked by a suitable bit toggling at the desired frequency or sample rate of those signals. Integrators/counters in the digital phased locked loop clocked by CLK can have bits which increment at various rates. In some cases, the bits can toggle at different power of 2 multiples of the desired output data rate (ODR). The more significant bits can toggle slower than the less significant bits. In some embodiments, the output of the transposed polynomial decimator circuit may be clocked at N*ODR, where the clock signal clocking that output (e.g., CLK2 shown in FIG. 2) can be generated from a suitable bit in a digital counter in the digital phase locked loop clocked by a clock signal having the oversampled rate (CLK). In some cases, the digital phase locked loop outputs one or more further clock signals at various integer multiples of the desired output data rate (e.g., powers of 2 multiple of ODR, e.g., ODR, 2*ODR, 4*ODR, 8*ODR . . . ) to clock one or more stages in the integer decimator circuit. As explained herein, the integer decimator circuit 106 can have a plurality of integer decimator circuit stages that decimates the signal progressively. The one or more further clock signals can drive those stages, and the one or more further clock signals can be generated from one or more respective bits in a digital counter in the digital phase locked loop clocked by the oversampled rate CLK.

Figure 19:
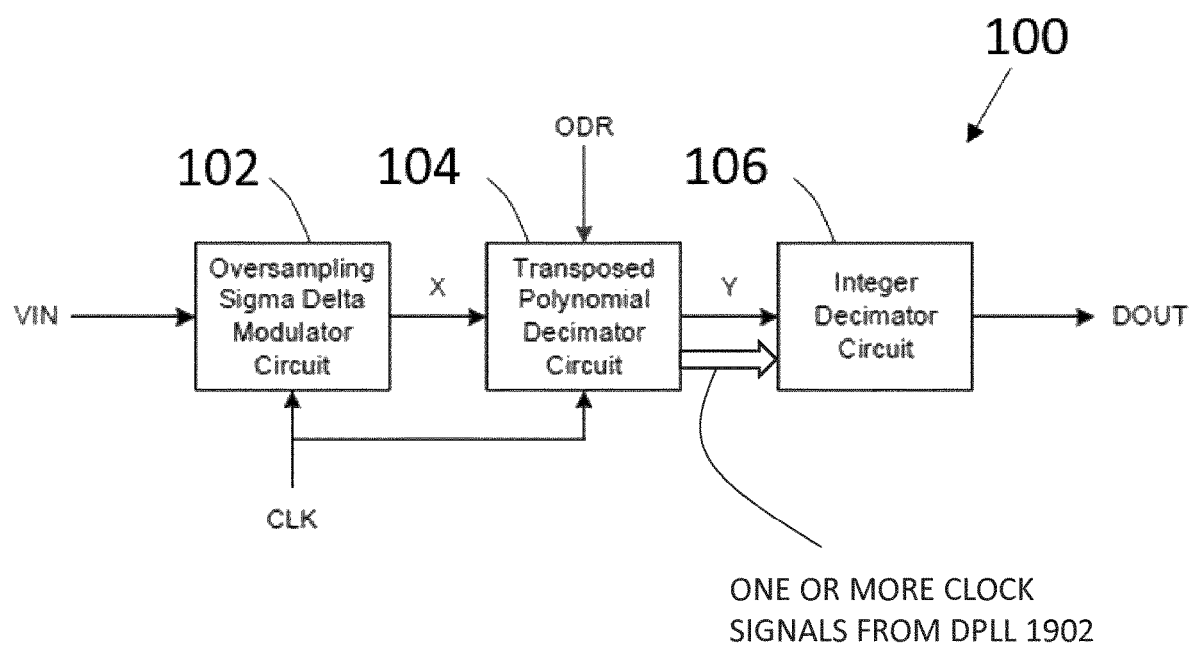
FIG. 19 depicts an exemplary converter circuit to provide oversampling sigma delta analog to digital conversion with a variable asynchronous output data rate having clocking provided by a digital phased locked loop of the circuit, according to some embodiments of the disclosure.

FIG. 19 depicts an exemplary converter circuit to provide oversampling sigma delta analog to digital conversion with a variable asynchronous output data rate having clocking provided by a digital phased locked loop of the circuit, according to some embodiments of the disclosure. The clock signals CLK2 of FIG. 2 and one or more further clock signals 1902 are generated by bits of the integrator/counter being clocked by CLK.

Figure 20:
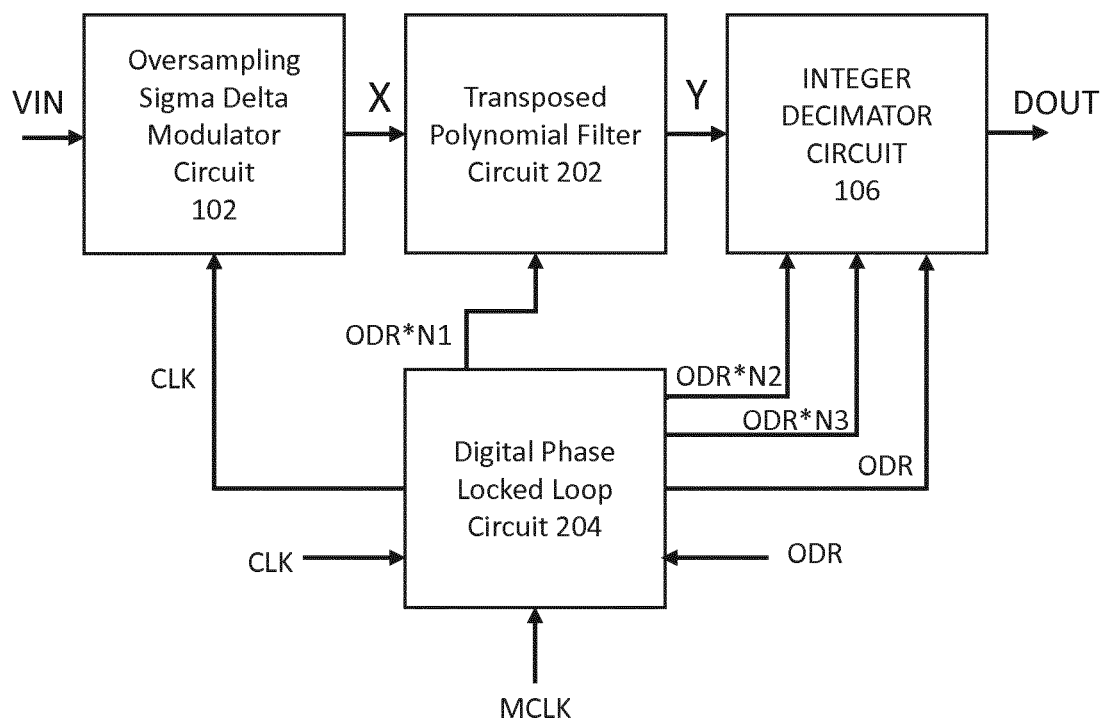
FIG. 20 depicts another exemplary converter circuit to provide oversampling sigma delta analog to digital conversion with a variable asynchronous output data rate having clocking provided by a digital phased locked loop of the circuit, according to some embodiments of the disclosure.

To examine further, FIG. 20 depicts another exemplary converter circuit to provide oversampling sigma delta analog to digital conversion with a variable asynchronous output data rate having clocking provided by a digital phased locked loop of the circuit, according to some embodiments of the disclosure. In its most general form, the digital phase locked loop circuit 204 can receive a first clock signal CLK having an input rate (e.g., OSR*FSIN), a second clock signal having an output rate (e.g., ODR), and may run from a third clock (MCLK), which is completely asynchronous to both the first and second clock signals. The function of the digital phase locked loop circuit 204 stays the same, where digital phase locked loop circuit 204 calculates the ratio between the input rate and the output rate (e.g., ratio associated with OSR*FSIN and ODR). In some embodiments, MCLK is the same as CLK to simply the illustration, but it is not necessary for MCLK to be the same as CLK.

While calculating the ratio of interest, the digital phase locked loop circuit 204 also provides the intersample position parameter to the transposed polynomial filter circuit 202. Depending on the implementation, the digital phase locked loop circuit 204 can generate and provide a plurality of clock signals, each having a frequency of a power of two multiple of ODR, between ODR and N*ODR. In this example, digital phase locked loop circuit 204 can generate clock signals having frequencies of ODR*N1, ODR*N2, ODR*N3, etc. for clocking the output of the transposed polynomial filter circuit 202 and any one or more stages of the integer decimation circuit 106. N1, N2, N3 are generally powers of two. The clock signals clock signals having frequencies of ODR*N1, ODR*N2, ODR*N3, etc. can be generated by bits of the integrator/counter being clocked by CLK.

Instead of generating these clock signals separately (using some other circuitry), these clock signals are locked by virtue of having the digital phased locked loop tracking ODR and CLK. The clocking of the converter circuit is thus improved and the design for the clocking scheme is simplified. Actual sampling rates in later parts of the circuit is made more consistent with the operations that are associated with the intersample position parameter. Because a single component, i.e., the digital phased locked loop circuit is generating the intersampling position parameter used by the transposed polynomial decimator circuit 104 and controlling the other sampling rates used by other parts of the converter circuit (including the oversampling sigma delta modualtor circuit 102, and the integer decimator circuit 106), both the datapath (the math going on in the transposed polynomial that uses the intersample position parameter) and the sampling rates used within the filter stages are locked-by-design.

Transposed Filters

Returning to a discussion of the difference between transposed and non-transposed filters, a digital filter may be transposed and still provide the same general relationship between inputs and outputs, i.e., the same transfer function, as a corresponding non-transposed filter. A digital filter may be transposed by exchanging inputs and outputs, reversing direction of all signal paths, converting branch points to summers, converting summers to branch points, converting hold and samples to integrate and dumps, changing the flow direction in all branches, etc. In other words, transposing a filter reverses the "flow graph" of the filter.

Figure 12:
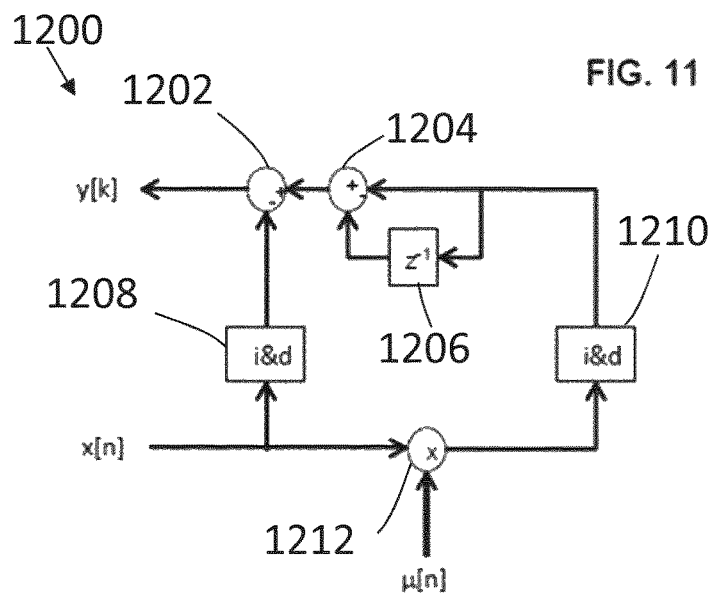
FIG. 12 depicts an exemplary transposed linear filter, i.e., a transposed first order polynomial filter, according to some embodiments of the disclosure.

To illustrate further, a first order filter may be considered for simplicity. FIG. 12 depicts an exemplary transposed linear filter 1200, i.e., a transposed first order polynomial filter, according to some embodiments of the disclosure. The transposed linear filter 1200 may receive an input data sequence x[n] and an intersample position parameter μ[n], and generate an output data sequence y[k] having samples positioned at the intersample position. The transposed linear filter 1200 may include one or more adders (e.g., 1202 and 1204), one or more delay elements (e.g., 1206), one or more integrate and dump elements (e.g., 1208 and 1210), one or more multipliers, (e.g., 1212) etc. The transposed linear filter 1200 may calculate a new sample as a function of the intersample position parameter, which in the case of the transposed linear filter 1200 may be the distance between the current input and the previous/last output normalized to the output period as follows:

$$\mu[n] = \left(n * \frac{fsout}{fsin}\right) - \text{floor}\left(n * \frac{fsout}{fsin}\right) \quad (1)$$

Figure 13:
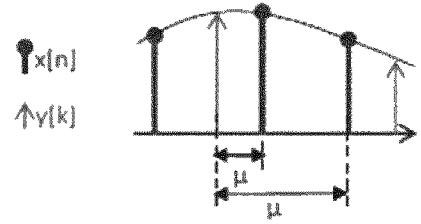
FIG. 13 is a signal diagram that depicts an exemplary intersample position parameter for transposed linear filtering.
Figure 14:
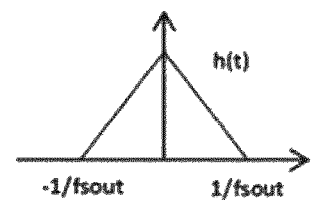
FIG. 14 is a graph depicting an exemplary transfer function for a transposed linear filter in the time domain.

FIG. 13 is a signal diagram that depicts an exemplary intersample position parameter for transposed linear filtering. FIG. 14 is a graph depicting an exemplary transfer function for a transposed linear filter in the time domain. This transfer function may be represented in the frequency domain as follows:

$$H(f) = \frac{\sin\left(\frac{\pi f}{fsout}\right)}{\left(\frac{\pi f}{fsout}\right)} \quad (2)$$

Figure 15:
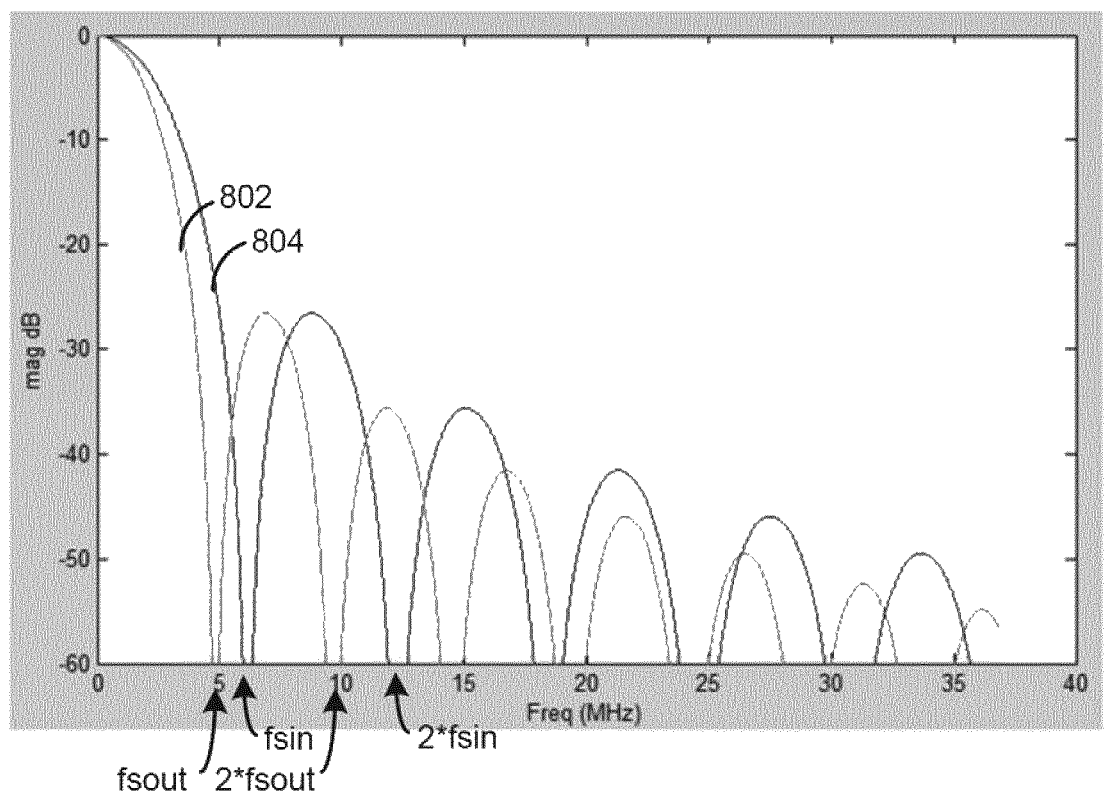
FIG. 15 is a graph that plots an embodiment of this transfer function 802 in the frequency domain.

FIG. 15 is a graph that plots an embodiment of this transfer function 802 in the frequency domain. As can be seen, the transfer function has zeros clustered about multiples of the output sample rate fsout, producing regions of maximum attenuation about the same frequencies.

In embodiments, the transposed polynomial filter 202 of the transposed polynomial decimator circuit 104 of FIG. 2 may be a first order transposed polynomial filter.

Figure 16:
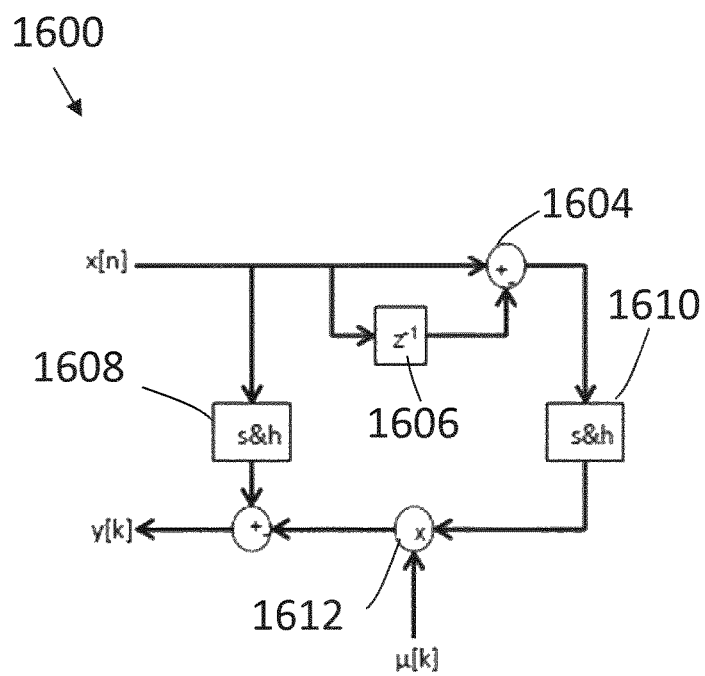
FIG. 16 depicts an exemplary non-transposed linear filter, i.e., a first order polynomial filter.

By contrast, FIG. 16 depicts an exemplary non-transposed linear filter 1600, i.e., a first order polynomial filter. The filter receive an input data sequence x[n] and an intersample position parameter u[k], and generates an output data sequence y[k] having samples positioned at the intersample position. The filter 1600 may include one or more adders (e.g., 1604), one or more delay elements (e.g., 1606), one or more sample and holds (e.g., 1608 and 1610), and one or more multipliers (e.g., 1612). The filter 1600 may calculate a new sample as a function of the intersample position parameter μ that may be the distance between the desired output input and the previous/last input normalized to the input period as follows:

$$\mu[n] = \left(k * \frac{fsin}{fsout}\right) - \text{floor}\left(k * \frac{fsin}{fsout}\right) \quad (3)$$

Figure 17:
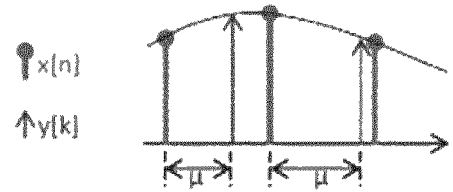
FIG. 17 is a signal diagram that depicts an exemplary intersample position parameter for linear interpolation.
Figure 18:
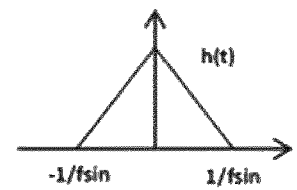
FIG. 18 is a graph depicting an exemplary transfer function for a polynomial filter in the time domain.

FIG. 17 is a signal diagram that depicts an exemplary intersample position parameter for linear interpolation. FIG. 18 is a graph depicting an exemplary transfer function for a polynomial filter in the time domain. This transfer function may be represented in the frequency domain as follows:

$$H(f) = \frac{\sin\left(\frac{\pi f}{fsin}\right)}{\left(\frac{\pi f}{fsin}\right)} \quad (4)$$

Returning to FIG. 15, this graph also shows an embodiment of this transfer function 804 in the frequency domain. As can be seen, the transfer function has zeros clustered about multiples of the input sample rate f sin, producing regions of maximum attenuation about the same frequencies.

Variations and Implementations

Example 1 is a variable output data rate converter circuit comprising: an oversampling sigma delta modulator circuit to quantize an analog input signal at an oversampled rate, and output an sigma delta modulated signal; a transposed polynomial decimator circuit to decimate the sigma delta modulated signal, and output a first decimated signal; and an integer decimator circuit to decimate the first decimated signal by an integer factor and output a second decimated signal having a desired output data rate; wherein the transposed polynomial decimator circuit has a transposed polynomial filter circuit and a digital phase locked loop circuit, which tracks a ratio between the desired output data rate and the oversampled rate, and outputs an intersample position parameter to the transposed polynomial filter circuit.

In Example 2, Example 1 can optionally include the oversampling signal delta modulator circuit quantizing the analog input signal at an oversampled rate synchronous to a received clock signal.

In Example 3, any one of the above Examples can further include the oversampling signal delta modulator circuit quantizing the analog input signal at an oversampled rate, which is a product of an oversampling ratio and a Nyquist frequency.

In Example 4, any one of the above Examples can further include the transposed polynomial decimator circuit outputting the first decimated signal at a first sample rate, which is a product of the integer and the desired output data rate.

In Example 5, any one of the above Examples can further include the transposed polynomial decimator circuit reducing the oversampled rate of the sigma delta modulated signal by a factor of a ratio between a first product of the integer and the desired output data rate and a second product of an oversampling ratio and the Nyquist frequency associated with the oversampling sigma delta modulator circuit.

In Example 6, any one of the above Examples can further include the desired output data rate being asynchronous relative to the oversampled rate of the oversampling sigma delta modulator.

In Example 7, any one of the above Examples can further include rate of the first decimated signal being asynchronous relative to the oversampled rate of the oversampling sigma delta modulator.

In Example 8, any one of the above Examples can further include the intersample position parameter being a distance between a current input sample to the transposed polynomial filter circuit and a last output sample of the transposed polynomial filter circuit.

In Example 9, any one of the above Examples can further include the digital phase locked loop outputing a second clock signal at an integer multiple of the desired output data rate to clock the first decimated signal generated by the transposed polynomial filter circuit.

In Example 10, Example 10 can further include the second clock signal being generated from a bit in a digital counter in the digital phase locked loop clocked by a clock signal having the oversampled rate.

In Example 11, any one of the above Examples can further include the digital phase locked loop outputting one or more further clock signals at various integer multiples of the desired output data rate to clock one or more stages in the integer decimator circuit.

In Example 12, Example 11 can further include the one or more further clock signals being generated from one or more respective bits in a digital counter in the digital phase locked loop clocked by a clock signal having the oversampled rate.

In Example 13, any one of the above Examples can further include a digital phase locked loop circuit receiving clock signal having an integer divided oversampled rate and uses the clock signal having the integer divided oversampled rate to track the ratio.

In Example 14, Example 13 can further include wherein the integer divided oversampled rate is the oversampled rate divided the integer factor of the integer decimated circuit.

Example 15 is a method for generating a decimated signal having a desired output data rate, the method comprising: receiving, by a digital phased locked loop, a first clock signal having an oversampled rate of an oversampling sigma delta modulator circuit and a second clock signal having the desired output data rate; and determining, by a digital phased locked loop, an intersample position parameter usable by a transposed polynomial decimator filter circuit based on the first and second clock signals, wherein the transposed polynomial decimator filter circuit decimates a sigma delta modulated signal from the oversampling sigma delta modulator based on the intersample position parameter, and an intermediate output of the transposed polynomial decimator filter circuit is decimated by an integer decimation circuit to generate the decimated signal having the desired output data rate.

In Example 16, any one of the above Examples can include tracking, by the digital phase locked loop, a ratio between the desired output data rate and the oversampled rate.

In Example 17, any one of the above Examples can include tracking, by the digital phase locked loop, a ratio between the desired output data rate multiplied by an integer factor of the integer decimation circuit and the oversampled rate.

In Example 18, any one of the above Examples can include tracking, by the digital phase locked loop, a ratio between the desired output data rate and the oversampled rate divided by an integer factor of the integer decimation circuit.

In Example 19, any one of the above Examples can include tracking, by the digital phase locked loop, a ratio between the desired output data rate and the oversampled rate divided by an integer factor.

In Example 20, any one of the above Examples can include outputting a further clock signal for clocking the intermediate output of the transposed polynomial filter circuit.

In Example 21, Example 20 can further include the further clock signal being based on a bit in a counter clocked by the first clock signal.

In Example 22, any one of the above Examples can include the intersample position parameter being a distance between a current input sample of the transposed polynomial decimator filter and a last output sample of the transposed polynomial decimator filter circuit.

In Example 23, any one of the above Examples can include determining the intersample position parameter comprising determining the intersample position parameter based on a value of a counter that is clocked by the first clock signal.

In Example 24, any one of the above Examples can include generating one or more further clock signals based on one or more bits of a counter that is clocked by the first clock signal, wherein the one or more clock signals are used for clocking one or more signals of the integer decimation circuit.

Example 25 is an apparatus for data conversion, the apparatus comprising: means for quantizing an analog input signal into a sigma delta modulated signal at an oversampled rate; means for tracking a ratio of the desired output data rate and the oversampled rate; means for asynchronously decimate the sigma delta modulated signal to an intermediate data signal based on an intersample position parameter associated with the ratio; and means for decimating the intermediate data signal by an integer factor to a desired output data rate.

In Example 26, any one of the above Examples can include means for tracking the ratio comprises means for receiving a clock signal having the desired output data rate and a clock signal having the oversampled rate.

In Example 27, any one of the above Examples can include the means for tracking the ratio comprising means for receiving a clock signal having the desired output data rate and a clock signal having the oversampled rate divided by the integer factor.

In Example 28, any one of the above Examples can include means for generating one or more clock signals to clock one or more signals in the means for decimating the intermediate data signal.

In Example 29, any one of the above Examples can include means for carrying out or implementing any one of the Examples 15-24.

Corresponding methods of operation and non-transitory storage mediums exist. Additional embodiments also exist. Any feature of any of the embodiments described herein can optionally be used in any other embodiment. Also, embodiments may optionally include any subset of the components or features discussed herein.

Note that the activities discussed above with reference to the FIGURES are applicable to any integrated circuits that involve digitizing an analog signal using an oversampling sigma delta modulator and generating a variable sample rate digital output. Some of these circuits involve signal processing, particularly those that can execute specialized software programs, or algorithms, some of which may be associated with processing digitized real-time data. Certain embodiments can relate to multi-DSP signal processing, floating point processing, signal/control processing, fixed-function processing, microcontroller applications, etc.

In certain contexts, the features discussed herein can be applicable to power line monitoring, medical systems, scientific instrumentation, wireless and wired communications, radar, industrial process control, audio and video equipment, current sensing, instrumentation (which can be highly precise), and other digital-processing-based systems. Moreover, certain embodiments discussed above can be provisioned in digital signal processing technologies for medical imaging, patient monitoring, medical instrumentation, and home healthcare. This could include pulmonary monitors, accelerometers, heart rate monitors, pacemakers, etc. Other applications can involve automotive technologies for safety systems (e.g., stability control systems, driver assistance systems, braking systems, infotainment and interior applications of any kind). Furthermore, powertrain systems (for example, in hybrid and electric vehicles) can use high-precision data conversion products in battery monitoring, control systems, reporting controls, maintenance activities, etc. In yet other example scenarios, the teachings of the present disclosure can be applicable in the industrial markets that include process control systems that help drive productivity, energy efficiency, and reliability. In consumer applications, the teachings of the signal processing circuits discussed above can be used for image processing, auto focus, and image stabilization (e.g., for digital still cameras, camcorders, etc.). Other consumer applications can include audio and video processors for home theater systems, DVD recorders, and high-definition televisions. Yet other consumer applications can involve advanced touch screen controllers (e.g., for any type of portable media device). Hence, such technologies could readily part of smartphones, tablets, security systems, PCs, gaming technologies, virtual reality, simulation training, etc.

In the discussions of the embodiments above, the capacitors, clocks, DFFs, dividers, inductors, resistors, amplifiers, switches, digital core, transistors, and/or other components can readily be replaced, substituted, or otherwise modified in order to accommodate particular circuitry needs. Moreover, it should be noted that the use of complementary electronic devices, hardware, software, etc. offer an equally viable option for implementing the teachings of the present disclosure.

Parts of various apparatuses for asynchronous sample rate conversion can include electronic circuitry to perform the functions described herein. In some cases, one or more parts of the apparatus can be provided by a processor specially configured for carrying out the functions described herein. For instance, the processor may include one or more application specific components, or may include programmable logic gates which are configured to carry out the functions describe herein. The circuitry can operate in analog domain, digital domain, or in a mixed signal domain. In some instances, the processor may be configured to carrying out the functions described herein by executing one or more instructions stored on a non-transitory computer medium.

In one example embodiment, any number of electrical circuits of the FIGURES may be implemented on a board of an associated electronic device. The board can be a general circuit board that can hold various components of the internal electronic system of the electronic device and, further, provide connectors for other peripherals. More specifically, the board can provide the electrical connections by which the other components of the system can communicate electrically. Any suitable processors (inclusive of digital signal processors, microprocessors, supporting chipsets, etc.), computer-readable non-transitory memory elements, etc. can be suitably coupled to the board based on particular configuration needs, processing demands, computer designs, etc. Other components such as external storage, additional sensors, controllers for audio/video display, and peripheral devices may be attached to the board as plug-in cards, via cables, or integrated into the board itself. In various embodiments, the functionalities described herein may be implemented in emulation form as software or firmware running within one or more configurable (e.g., programmable) elements arranged in a structure that supports these functions. The software or firmware providing the emulation may be provided on non-transitory computer-readable storage medium comprising instructions to allow a processor to carry out those functionalities.

In another example embodiment, the electrical circuits of the FIGURES may be implemented as stand-alone modules (e.g., a device with associated components and circuitry configured to perform a specific application or function) or implemented as plug-in modules into application specific hardware of electronic devices. Note that particular embodiments of the present disclosure may be readily included in a system on chip (SOC) package, either in part, or in whole. An SOC represents an IC that integrates components of a computer or other electronic system into a single chip. It may contain digital, analog, mixed-signal, and often radio frequency functions: all of which may be provided on a single chip substrate. Other embodiments may include a multi-chip-module (MCM), with a plurality of separate ICs located within a single electronic package and configured to interact closely with each other through the electronic package. In various other embodiments, the functionalities may be implemented in one or more silicon cores in Application Specific Integrated Circuits (ASICs), Field Programmable Gate Arrays (FPGAs), and other semiconductor chips.

It is also imperative to note that all of the specifications, dimensions, and relationships outlined herein (e.g., the number of processors, logic operations, etc.) have only been offered for purposes of example and teaching only. Such information may be varied considerably without departing from the spirit of the present disclosure, or the scope of the appended claims. The specifications apply only to one non-limiting example and, accordingly, they should be construed as such. In the foregoing description, example embodiments have been described with reference to particular processor and/or component arrangements. Various modifications and changes may be made to such embodiments without departing from the scope of the appended claims. The description and drawings are, accordingly, to be regarded in an illustrative rather than in a restrictive sense.

Note that with the numerous examples provided herein, interaction may be described in terms of two, three, four, or more electrical components. However, this has been done for purposes of clarity and example only. It should be appreciated that the system can be consolidated in any suitable manner. Along similar design alternatives, any of the illustrated components, modules, and elements of the FIGURES may be combined in various possible configurations, all of which are clearly within the broad scope of this Specification. In certain cases, it may be easier to describe one or more of the functionalities of a given set of flows by only referencing a limited number of electrical elements. It should be appreciated that the electrical circuits of the FIGURES and its teachings are readily scalable and can accommodate a large number of components, as well as more complicated/sophisticated arrangements and configurations. Accordingly, the examples provided should not limit the scope or inhibit the broad teachings of the electrical circuits as potentially applied to a myriad of other architectures.

Note that in this Specification, references to various features (e.g., elements, structures, modules, components, steps, operations, characteristics, etc.) included in "one embodiment", "example embodiment", "an embodiment", "another embodiment", "some embodiments", "various embodiments", "other embodiments", "alternative embodiment", and the like are intended to mean that any such features are included in one or more embodiments of the present disclosure, but may or may not necessarily be combined in the same embodiments.

It is also important to note that the functions related to asynchronous sample rate conversion for an oversampling sigma delta analog to digital converter, illustrate only some of the possible functions that may be executed by, or within, systems illustrated in the FIGURES. Some of these operations may be deleted or removed where appropriate, or these operations may be modified or changed considerably without departing from the scope of the present disclosure. In addition, the timing of these operations may be altered considerably. The preceding operational flows have been offered for purposes of example and discussion. Substantial flexibility is provided by embodiments described herein in that any suitable arrangements, chronologies, configurations, and timing mechanisms may be provided without departing from the teachings of the present disclosure.

Numerous other changes, substitutions, variations, alterations, and modifications may be ascertained to one skilled in the art and it is intended that the present disclosure encompass all such changes, substitutions, variations, alterations, and modifications as falling within the scope of the appended claims.

Note that all optional features of the apparatus described above may also be implemented with respect to the method or process described herein and specifics in the examples may be used anywhere in one or more embodiments.

The invention claimed is:

1. A variable output data rate converter circuit comprising:
   an oversampling sigma delta modulator circuit to quantize an analog input signal at an oversampled rate, and output an sigma delta modulated signal;
   a transposed polynomial decimator circuit to decimate the sigma delta modulated signal, and output a first decimated signal; and
   an integer decimator circuit to decimate the first decimated signal by an integer factor and output a second decimated signal having a desired output data rate;
   wherein:
      the transposed polynomial decimator circuit has a transposed polynomial filter circuit and a digital phase locked loop circuit, which tracks a ratio between the desired output data rate and the oversampled rate, and outputs an intersample position parameter to the transposed polynomial filter circuit;
      the intersample position is normalized at the desired output data rate; and
      the transposed polynomial filter circuit has a transfer function, which has regions of maximum attenuation clustered about multiples of the desired output data rate.

2. The variable output data rate converter circuit of claim 1, wherein the digital phase locked loop outputs a second clock signal at an integer multiple of the desired output data rate to clock the first decimated signal generated by the transposed polynomial filter circuit.

3. The variable output data rate converter circuit of claim 2, wherein the second clock signal is generated from a bit in a digital counter in the digital phase locked loop clocked by a clock signal having the oversampled rate.

4. The variable output data rate converter circuit of claim 1, wherein the digital phase locked loop outputs one or more further clock signals at various integer multiples of the desired output data rate to clock one or more stages in the integer decimator circuit.

5. The variable output data rate converter circuit of claim 4, wherein the one or more further clock signals are generated from one or more respective bits in a digital counter in the digital phase locked loop clocked by a clock signal having the oversampled rate.

6. The variable output data rate converter circuit of claim 1, wherein:
   a digital phase locked loop circuit receives clock signal having an integer divided oversampled rate and uses the clock signal having the integer divided oversampled rate to track the ratio.

7. The variable output data rate converter circuit of claim 6, wherein the integer divided oversampled rate is the oversampled rate divided the integer factor of the integer decimator circuit.

8. A method for generating a decimated signal having a desired output data rate, the method comprising:
   receiving, by a digital phased locked loop, a first clock signal having an oversampled rate of an oversampling sigma delta modulator circuit and a second clock signal having the desired output data rate; and
   determining, by a digital phase locked loop, an intersample position parameter usable by a transposed polynomial decimator filter circuit based on the first and second clock signals, wherein the intersample position parameter is normalized at the desired output data rate;
   decimating, by the transposed polynomial decimator filter circuit, a sigma delta modulated signal from the oversampling sigma delta modulator circuit based on the intersample position parameter, wherein the transposed polynomial decimator filter circuit has a transfer function having zeros at multiples of the desired output data rate; and
   decimating, by an integer decimation circuit, an intermediate output of the transposed polynomial decimator filter circuit to generate the decimated signal having the desired output data rate.

9. The method of claim 8, further comprising:
   tracking, by the digital phase locked loop, a ratio between the desired output data rate and the oversampled rate.

10. The method of claim 8, further comprising:
    tracking, by the digital phase locked loop, a ratio between the desired output data rate multiplied by an integer factor of the integer decimation circuit and the oversampled rate.

11. The method of claim 8, further comprising:
tracking, by the digital phase locked loop, a ratio between the desired output data rate and the oversampled rate divided by an integer factor of the integer decimation circuit.

12. The method of claim 8, further comprising:
tracking, by the digital phase locked loop, a ratio between the desired output data rate and the oversampled rate divided by an integer factor.

13. The method of claim 8, further comprising:
outputting a further clock signal for clocking the intermediate output of the transposed polynomial decimator filter circuit.

14. The method of claim 13, wherein the further clock signal is based on a bit in a counter clocked by the first clock signal.

15. The method of claim 8, wherein:
determining the intersample position parameter comprises determining the intersample position parameter based on a value of a counter that is clocked by the first clock signal.

16. The method of claim 8, further comprising:
generating one or more further clock signals based on one or more bits of a counter that is clocked by the first clock signal, wherein the one or more further clock signals are used for clocking one or more signals of the integer decimation circuit.

17. An apparatus for data conversion, the apparatus comprising:
means for quantizing an analog input signal into a sigma delta modulated signal at an oversampled rate;
means for tracking a ratio of a desired output data rate and the oversampled rate;
means for determining an intersample position parameter that is associated with the ratio and is normalized at the desired output data rate;
means for decimating the sigma delta modulated signal to an intermediate data signal based on the intersample position parameter and attenuating shaped noise in the sigma delta modulated signal around multiples of the desired output data rate; and
means for decimating the intermediate data signal by an integer factor to the desired output data rate.

18. The apparatus of claim 17, wherein the means for tracking the ratio comprises means for receiving a clock signal having the desired output data rate and a clock signal having the oversampled rate.

19. The apparatus of claim 17, wherein the means for tracking the ratio comprises means for receiving a clock signal having the desired output data rate and a clock signal having the oversampled rate divided by the integer factor.

20. The apparatus of claim 17, further comprising means for generating one or more clock signals to clock one or more signals in the means for decimating the intermediate data signal.

* * * * *